(12) United States Patent
Murphy et al.

(10) Patent No.: US 8,514,014 B2
(45) Date of Patent: Aug. 20, 2013

(54) RESET AND RESETTABLE CIRCUITS

(75) Inventors: Cathal Murphy, Annacotty (IE); Michael Coln, Lexington, MA (US); Gary Carreau, Plaistow, NH (US); Alain Valentin Guery, Andover, MA (US); Bruce Amazeen, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 34 days.

(21) Appl. No.: 13/023,751

(22) Filed: Feb. 9, 2011

(65) Prior Publication Data

US 2012/0200350 A1 Aug. 9, 2012

(51) Int. Cl.
  *H03F 1/02* (2006.01)
(52) U.S. Cl.
  USPC ............................................. 330/9; 341/172
(58) Field of Classification Search
  USPC ................. 330/9, 124 R, 295; 341/172, 155, 341/120
  See application file for complete search history.

(56) References Cited

U.S. PATENT DOCUMENTS

| 6,597,925 | B1 | 7/2003 | Garcia et al. |
| 6,744,258 | B2 | 6/2004 | Ishio et al. |
| 6,795,006 | B1 | 9/2004 | Delight et al. |
| 7,026,853 | B2 | 4/2006 | Hairston |
| 7,295,143 | B2 * | 11/2007 | Ambo et al. ................. 341/172 |

OTHER PUBLICATIONS

Analog Devices Inc., "ADAS1128: 128-Channel, 24-Bit Current-to-Digital ADC", Datasheet, Revision SpC, Sep. 2010.
International Search Report and Written Opinion of the International Searching Authority in counterpart International Application No. PCT/US2012/024280, report dated Jun. 8, 2012.

* cited by examiner

*Primary Examiner* — Hieu Nguyen
(74) *Attorney, Agent, or Firm* — Kenyon & Kenyon LLP

(57) ABSTRACT

An amplifier system can include a feedback amplifier circuit having an amplifier, a feedback capacitor connected between an input terminal and an output terminal of the amplifier by at least one first switch, and a reset capacitor connected across the feedback capacitor by at least one second switch and between a pair of reference voltages by at least one third switch. During an input-signal processing phase of operation, a control circuit may close the at least one first switch and open the at least one second switch to electrically connect the feedback capacitor between the input and output terminals to engage feedback processing by the feedback amplifier circuit, and close the third switch to electrically connect the reset capacitor between the first and second voltages to charge the reset capacitor to a selectable voltage difference. During a reset phase of operation, the control circuit may open the at least one third switch, close the at least one second switch and open the at least one first switch to electrically connect the reset capacitor across the feedback capacitor to reset the feedback capacitor using the reset capacitor. The amplifier system can optionally include a plurality of the feedback amplifier circuits.

33 Claims, 8 Drawing Sheets

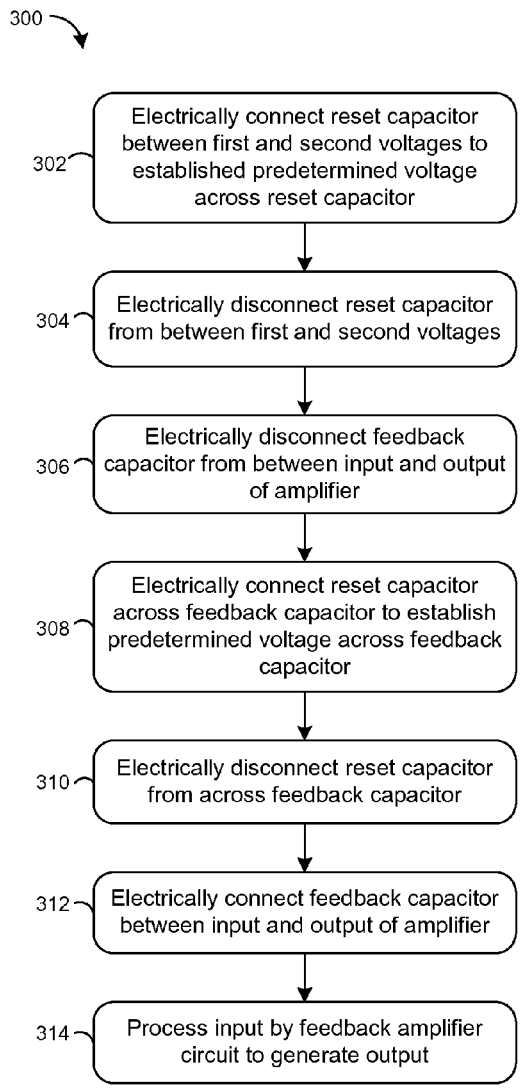
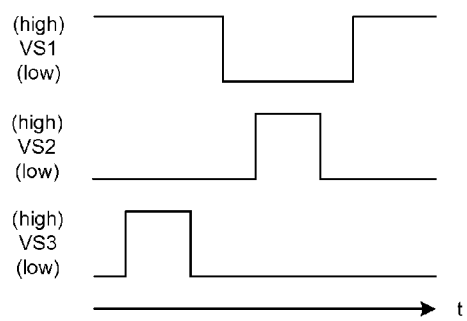
FIG. 4
FIG. 3

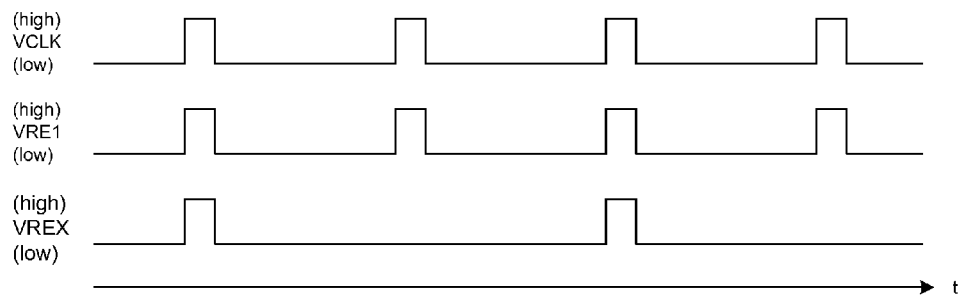
FIG. 9
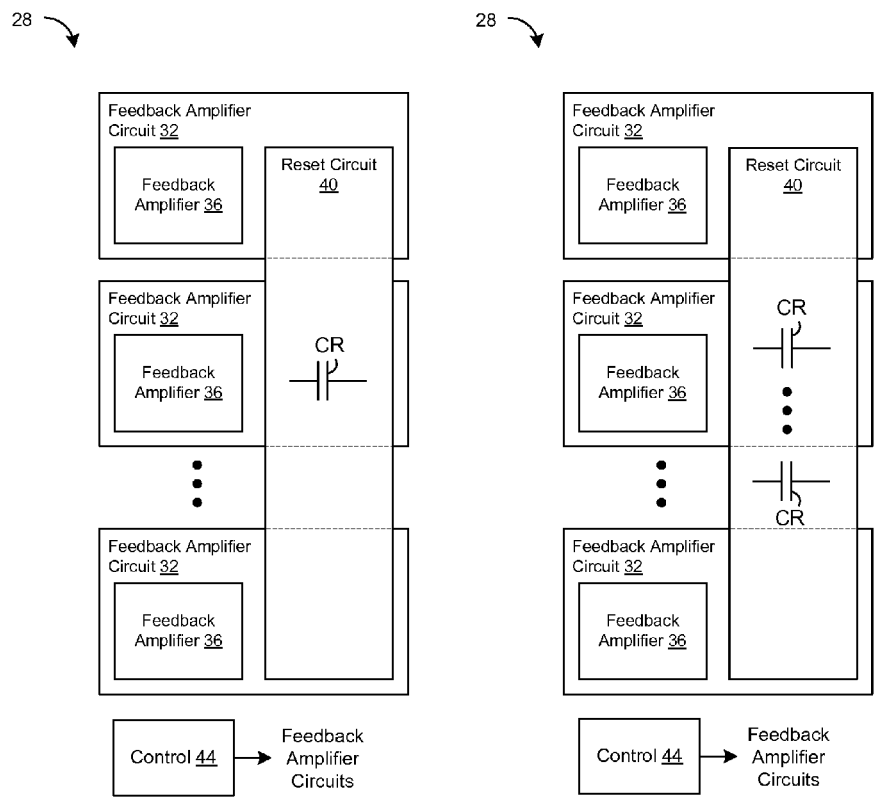
FIG. 10  FIG. 11

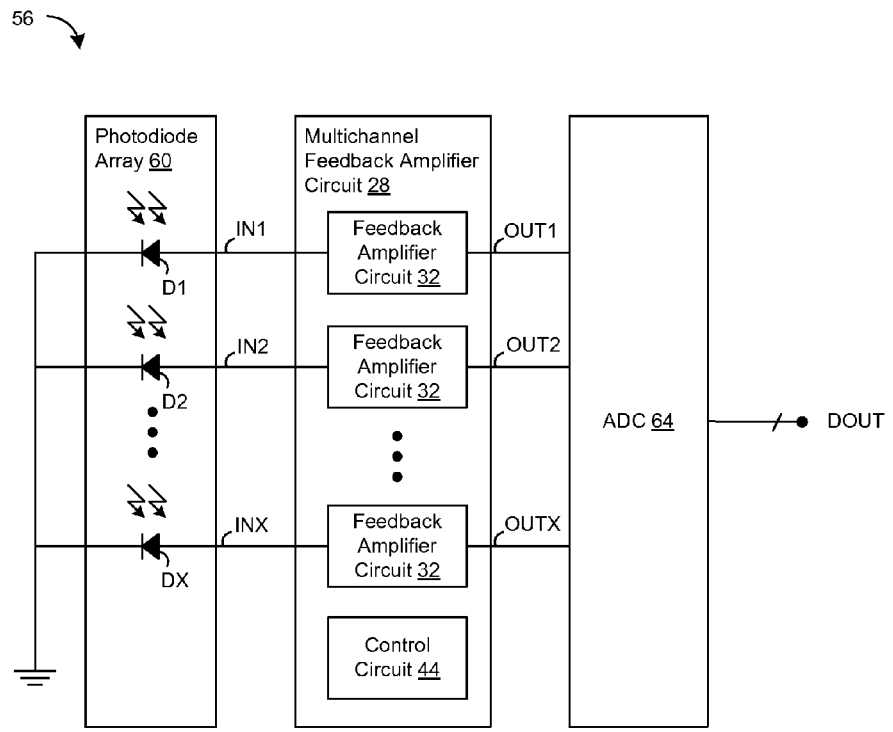
FIG. 12
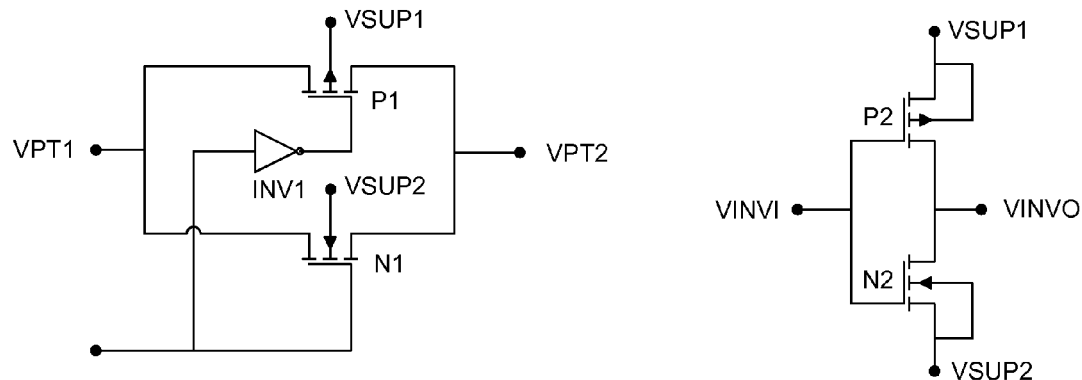
FIG. 13
FIG. 14

RESET AND RESETTABLE CIRCUITS

BACKGROUND INFORMATION

Integrators and other types of circuits may need to be reset during operation to avoid entering non-linear or otherwise undesirable operating regimes. For example, an integrator can be used to produce an output that is an integration of a signal at its input. During operation, under certain input conditions the output may rise in magnitude continuously until an amplifier of the integrator is forced into non-linear operation. In this situation, it may be desirable to reset the integrator to allow it to continue integrating from a reset output voltage, thus allowing the amplifier to continue operating in a linear or otherwise desirable regime.

FIG. 1 depicts an integrator circuit 20 having a reset capability. The integrator 20 includes an amplifier 24 connected in a negative feedback configuration, with a feedback capacitor C1 connected between its output and a negative input terminal by two feedback switches SA. In operation, the integrator 20 can integrate an input signal INA to produce an output signal OUTA when the feedback switches SA are closed and the feedback loop is active. If the integrator 20 integrates certain input signals for a relatively long time period, the output signal OUTA may eventually rise to a level that can place devices internal to the amplifier 24 in an operating regime that can produce non-linear or otherwise undesirable behavior. To avoid this, the voltage across the capacitor C1, and thus the output voltage OUTA, can be reset to a known value by first opening the feedback switches SA and then closing two reset switches SB, thereby connecting the feedback capacitor C1 between first and second bias voltages VA, VB to establish a voltage difference VA-VB across the capacitor C1. Subsequently, the reset switches SB can be reopened and the feedback switches SA reclosed to resume integration of the input signal INA. When integrating is resumed, e.g., when the feedback switches SA are again closed, the output OUTA can again represent an integration of the input signal INA, although with an output signal beginning from a reset output signal value.

The integrator reset configuration depicted in FIG. 1, however, can be problematic when employed in multichannel or other embodiments. If a plurality of the depicted integrators 20 are used in parallel, and each of a plurality of feedback capacitors C1 are connected to the first and second bias voltages VA, VB by a plurality of reset switches SB, unpredictable and undesirable reset behavior may result. Each time the feedback capacitor C1 of FIG. 1 is reset, the bias voltages VA, VB may undergo an associated deviation from their values as current is drawn from the bias voltage terminals. This can undesirably alter the value of the voltage imposed on the feedback capacitor C1 during the reset operation, and thereby reduce the accuracy with which the reset is conducted. This effect may be exacerbated in an unpredictable manner in the context of the plurality of integrators 20 where each may or may not reset at the same or different times. If an indeterminate subset of a plurality of the integrators 20 reset at the same time, the total capacitance placed across the bias voltages VA, VB, and thereby the degree of deviation from the reset voltage and the accuracy of the reset operation, may be rendered unpredictable.

Thus, a need exists to implement reset in feedback amplifier circuits in a predictable and accurate manner.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

FIG. 3 is a flowchart depicting an embodiment of a method of resetting the feedback amplifier circuit or the multichannel feedback amplifier circuit depicted in FIG. 2.

FIG. 4 is a signal diagram depicting embodiments of control signals for controlling switches of the feedback amplifier circuit or multichannel feedback amplifier circuit during the method of FIG. 3.

FIG. 9 is a signal diagram depicting embodiments of additional control signals generated or used by the control circuit.

FIG. 10 is a circuit schematic depicting another embodiment of the multichannel feedback amplifier circuit.

FIG. 11 is a circuit schematic depicting another embodiment of the multichannel feedback amplifier circuit.

FIG. 12 is a circuit schematic depicting an embodiment of a radiation detection circuit including the multichannel feedback amplifier circuit.

FIG. 13 is a circuit schematic depicting an embodiment of a switch of the feedback amplifier circuit or multichannel feedback amplifier circuit.

FIG. 14 is a circuit schematic depicting an embodiment of an inverter of the switch.

DETAILED DESCRIPTION OF EXAMPLE EMBODIMENTS

An amplifier system can include a feedback amplifier circuit having an amplifier, a feedback capacitor connected between an input terminal and an output terminal of the amplifier by at least one first switch, and a reset capacitor connected across the feedback capacitor by at least one second switch and between a pair of reference voltages by at least one third switch. During an input-signal processing phase of operation, a control circuit may close the at least one first switch and open the at least one second switch to electrically connect the feedback capacitor between the input and output terminals to engage feedback processing by the feedback amplifier circuit, and close the third switch to electrically connect the reset capacitor between the first and second voltages to charge the reset capacitor to a selectable voltage difference. During a reset phase of operation, the control circuit may open the at least one third switch, close the at least one second switch and open the at least one first switch to electrically connect the reset capacitor across the feedback capacitor to reset the feedback capacitor using the reset capacitor. The amplifier system can optionally include, and engage in input-signal processing and reset phases of operation of, a plurality of the feedback amplifier circuits.

Figure 1:
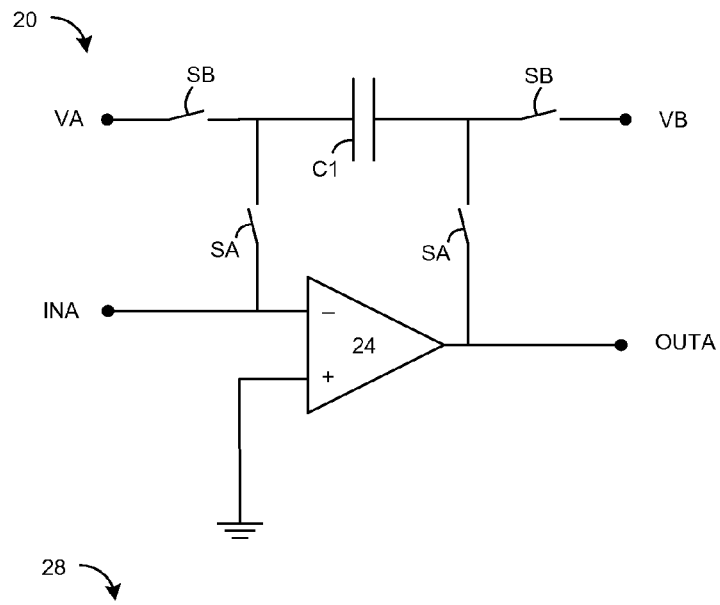
FIG. 1 is a circuit schematic depicting an embodiment of an integrator circuit having a reset functionality.
Figure 2:
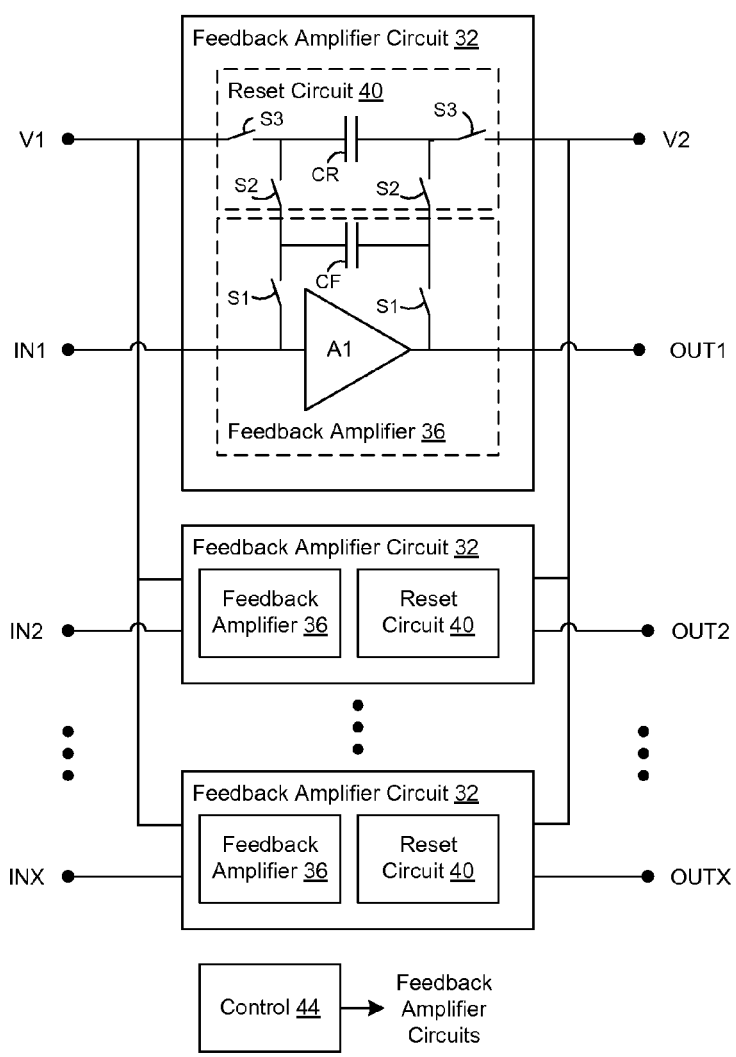
FIG. 2 is a circuit schematic depicting an embodiment of a multichannel feedback amplifier circuit having one or more resettable feedback amplifier circuits.

FIG. 2 depicts an embodiment of a multichannel feedback amplifier circuit 28 that may generate a plurality of outputs OUT1-OUTX according to an amplification or other processing operation performed on a plurality of inputs IN1-INX. The multichannel feedback circuit 28 can include one or more feedback amplifier circuits 32 and a control circuit 44. Each of the feedback amplifier circuits 32 can include a feedback amplifier 36 and a reset circuit 40. Each feedback amplifier 36 can include a feedback capacitor CF selectively connected between an input and output of an amplifier A1 to implement the amplification or processing operation on an input signal IN1 to generate a corresponding output signal OUT1. For example, the feedback amplifier may generate an output OUT1 representing an integration of the input signal IN1, a multiplication of the input signal IN1 by a selected frequency response (e.g., to amplify and/or filter the input signal), or any other processing that can be performed by a feedback amplifier. The reset circuit 40 can include a reset capacitor CR selectively connected between first and second voltages V1, V2, as well as across the feedback capacitor CF, to reset a voltage across the feedback capacitor CF to a reset voltage difference, e.g., a value as a function of the difference between the first and second voltages V1-V2. The control circuit 44 may control the operation of the plurality of feedback amplifier circuits 32, and may generate and provide various enable, clock and any other control signals as described herein.

In more detail, the feedback capacitor CF of the feedback amplifier 36 can be physically connected between an input and the output of the amplifier A1 by a plurality of first switches S1. Note that, although FIG. 2 shows a single-ended input, single-ended output amplifier A1, the amplifier A1 can have any of single-ended or differential inputs or outputs. The first switches S1 can be closed, i.e., enabled, to electrically connect the feedback capacitor CF between the input and output of the amplifier A1. As exemplarily depicted in FIG. 2, the first switches S1 may connect a single feedback capacitor CF directly between the input and output of the amplifier A1 to implement, e.g., an integrator, i.e., to generate an output signal OUT1 that represents an integration of the input signal IN1.

The reset capacitor CR of the reset circuit 40 can be physically connected across the feedback capacitor CF, and between the first and second voltages V1, V2, by a plurality of second and third switches S2, S3, respectively. The second switches S2 can be closed to electrically connect the reset capacitor CR across the feedback capacitor CF. The third switches S3 can be closed to electrically connect the reset capacitor CR between the first and second voltages V1, V2.

FIG. 3 depicts an embodiment of a method 300 of resetting the feedback capacitor CF of the feedback amplifier circuit 32 and plurality of feedback capacitors CF of the multichannel feedback amplifier circuit 28. FIG. 4 depicts embodiments of control signals VS1, VS2, VS3 that can be generated by the control circuit 44 and used to open and close, i.e., disable and enable, the first, second and third switches S1, S2, S3 of the feedback amplifier circuit 32 in embodiments of the method 300 of FIG. 3. As applied to the multichannel feedback amplifier circuit 28, the method 300 of FIG. 3 can be used to reset a selectable, potentially varying number of the plurality of feedback capacitors CF of the plurality of feedback amplifier circuits 33 without subjecting the first and second voltages V1, V2 to an indeterminate and changing total capacitance, and thereby preserving the accuracy and predictability and of the first and second voltages V1, V2, and the accuracy of a selectable voltage difference imposed on a selectable number of the feedback capacitors CF, and thus the accuracy and predictability of the resetting of the feedback capacitors CF, during performance of the method 300.

In step 302, the reset capacitor CR can be electrically connected between the first and second voltages V1, V2 to charge and establish a selectable voltage difference across the reset capacitor CR. This can be accomplished by closing the third switches S3 to electrically connect the reset capacitor CR between the first and second voltages V1, V2, with the second switches S2 simultaneously open to electrically disconnect the reset capacitor CR from across the feedback capacitor CF. In FIG. 4, a third control signal VS3 can transition from a logic low state to a logic high state to close the third switches S3, simultaneous with a second control signal VS2, delivered to the second switch S2, being at a logic low state to keep the second switches S2 open. The selectable voltage difference established across the reset capacitor CR can be a function of the values of the first and second voltages V1, V2 as they exist without the reset capacitor CR connected therebetween, the capacitance value of the reset capacitor CR, and the amount of charge existing on the reset capacitor CR before it is connected between the first and second voltages V1, V2.

In step 304, which can be performed after step 302, the reset capacitor CR can be electrically disconnected from between the first and second voltages V1, V2 to disengage the reset capacitor CR from being charged by the first and second voltages V1, V2. This can be accomplished by opening the third switches S3 to electrically disconnect the reset capacitor CR from between the first and second voltages V1, V2. In FIG. 4, the third control signal VS3 delivered to the third switches S3 can go from a logic high state to a logic low state to open the third switches S3.

In step 306, which can be performed after step 304, the feedback capacitor CF can be removed from being electrically connected between the input and output of the amplifier A1 to disengage the feedback capacitor CF from actively performing the feedback signal processing of the feedback amplifier 36. This can be accomplished by opening the first switches S1 to electrically disconnect the feedback capacitor CF from between the input and output of the amplifier A1. In FIG. 4, a first control signal VS1 delivered to the first switches S1 can go from a logic high state to a logic low state to open the first switches S1.

In step 308, which can be performed after step 306, the reset capacitor CR can be electrically connected across the feedback capacitor CF to reset the voltage across the feedback capacitor CF by electrically connecting the reset capacitor CR across the feedback capacitor CF. This can be accomplished by closing the second switches S2 to electrically connect the reset capacitor CR across the feedback capacitor CF. In FIG. 4, the second control signal VS2 delivered to the second switches S2 can go from a logic low state to a logic high state to close the second switches S2. As a result of step 308, a voltage across the feedback capacitor CF can be reset to a reset voltage difference that is a function of the voltage difference existing across on the reset capacitor CR at the time of reset, the capacitance values of the reset and feedback capacitors CR, CF, and an amount of charge stored on the reset and feedback capacitors CR, CF prior to the reset.

In step 310, which can be performed after step 308, the reset capacitor CR can be removed from being electrically connected across the feedback capacitor CF to disengage the reset capacitor CR from resetting the voltage across the feedback capacitor CF. This can be accomplished by opening the second switches S2 to electrically disconnect the reset capacitor CR from across the feedback capacitor CF. In FIG. 4, the second control signal VS2 delivered to the second switches S2 can go from a logic high state to a logic low state to open the second switches S2.

In step 312, which can be performed after step 310, the feedback capacitor CF can be electrically connected back between the input and output of the amplifier A1 to resume feedback processing of the input signal IN1 to produce the output signal OUT1 by the feedback amplifier 36. This can be accomplished by closing the first switches S1 to electrically connect the feedback capacitor CF between the input and output of the amplifier A1. In FIG. 4, the first control signal VS1 delivered to the first switches S1 can go from a logic low state to a logic high state to close the first switches S1. In step 314, which can be performed after step 312, the feedback amplifier CF can resume processing of the input IN1 to generate the output OUT1. The resumed processing can resume with the output OUT1 beginning at a reset output voltage value.

As discussed above, the method 300 of FIG. 3 can be performed either involving only a single feedback amplifier circuit 32 or involving the entire multichannel feedback amplifier circuit 28. In a multichannel embodiment of the method 300, step 302 can be performed simultaneously for each of, or a selected number of, the plurality feedback amplifier circuits 32. That is, each of, or a selected number of, the reset capacitors CR of the plurality of feedback amplifier circuits 32 can be simultaneously electrically connected between the first and second voltages V1, V2. For a given embodiment of the multichannel feedback amplifier circuit 28, the number of the plurality of feedback amplifier circuits 32, and thus the number of the plurality of reset capacitors CR, can generally be known, and the effect of connecting the known plurality of reset capacitors CR across the first and second voltages V1, V2, and thus a requisite voltage level and responsiveness to capacitance of the first and second voltages V1, V2, can be planned and accommodated to ensure desired levels of accuracy of the reset operation. For example, if the multichannel feedback amplifier circuit 28 includes X reset capacitors CR, each having a capacitance value of C, then the first and second voltages V1, V2 can be designed to impose upon the parallel combination of X reset capacitors CR, having a total capacitance value of XC, a selectable voltage difference having a desired accuracy of magnitude. At step 304, each of, or the selected number of, the plurality of reset capacitors CR can then be electrically disconnected from between the first and second voltages V1, V2.

At step 306, a selected number of the plurality of feedback capacitors CF can then be removed from being electrically connected between the inputs and outputs of their corresponding amplifiers A1. The number of feedback capacitors CF disconnected can be selected at the time of performance of the method 300, and can vary according to variable electrical conditions that the multichannel feedback amplifier circuit 28 may face at the time of performance, without impacting the accuracy of the reset operation for those feedback capacitors CF that are reset. At step 308, the reset capacitors CR corresponding to the selected feedback capacitors CF can be electrically connected across the selected feedback capacitors CF to reset the selected feedback capacitors CF to set a reset voltage difference on the selected feedback capacitors CF. In this way, a selectable number of feedback capacitors CF can be reset without the number selected affecting the accuracy of the reset operation. The multichannel feedback amplifier circuit 28 can thus accurately reset a variable number of its feedback amplifier circuits 32. The number of feedback amplifier circuits 32 reset can be variably selected during operation of the multichannel feedback amplifier circuit 28 in processing the plurality of inputs IN1-INX to generate the plurality of outputs OUT1-OUTX, e.g., based on the voltage magnitude values of each of the plurality of outputs OUT1-OUTX at any given time during processing.

At step 310, the reset capacitors CR corresponding to the selected feedback capacitors CF can be electrically disconnected from across the selected feedback capacitors CF. At step 312, the selected feedback capacitors CF can be electrically connected again between the inputs and outputs of their corresponding amplifiers A1. At step 314, the processing by the feedback amplifier circuits 32 corresponding to the selected feedback capacitors CF can resume.

In embodiments of the method 300, the ordering of the steps depicted in FIG. 3 can optionally be varied. For example, the relative ordering of steps 304 and 306, i.e., the electrically disconnecting of the reset capacitor CR from across the first and second voltages V1, V2 and electrically disconnecting of the feedback capacitor CF from between the input and output of the amplifier A1, can each occur either before, after or simultaneous with the other. Other changes to the order of the steps of FIG. 3 may occur depending on the application in which the multichannel feedback amplifier circuit 28 is employed. Thus, the relative timing of the first, second and third control signals VS1, VS2, VS3 of the embodiments of FIG. 4 may vary according to different embodiments of the method 300 of FIG. 3. Additionally, the relative length of time for which any of the first, second and third control signals VS1, VS2, VS3 remains in the logic high or logic low states can also vary from the exemplary relative lengths of time depicted in FIG. 4. For example, the length of time for which the third switches S3 remain closed, i.e., the length of time of the logic high state of the third switching signal VS3, can depend on the total reset capacitor capacitance value expected to be applied across the first and second voltages V1, V2, and the speed at which the first and second voltages can charge that total capacitance value. A larger total reset capacitance may require a longer length of time for the logic high state of the third control signal VS3. Similarly, the length of time during which the second switches S2 remain closed, i.e., the length of time of the logic high state of the second switching signal VS2, can depend on the relative capacitance values of each reset capacitor CR and corresponding feedback capacitor CF. A relatively larger ratio of the reset capacitance value to the corresponding feedback capacitance value may require a relatively shorter length of time for the logic high state of the second control signal VS2.

Figure 5:
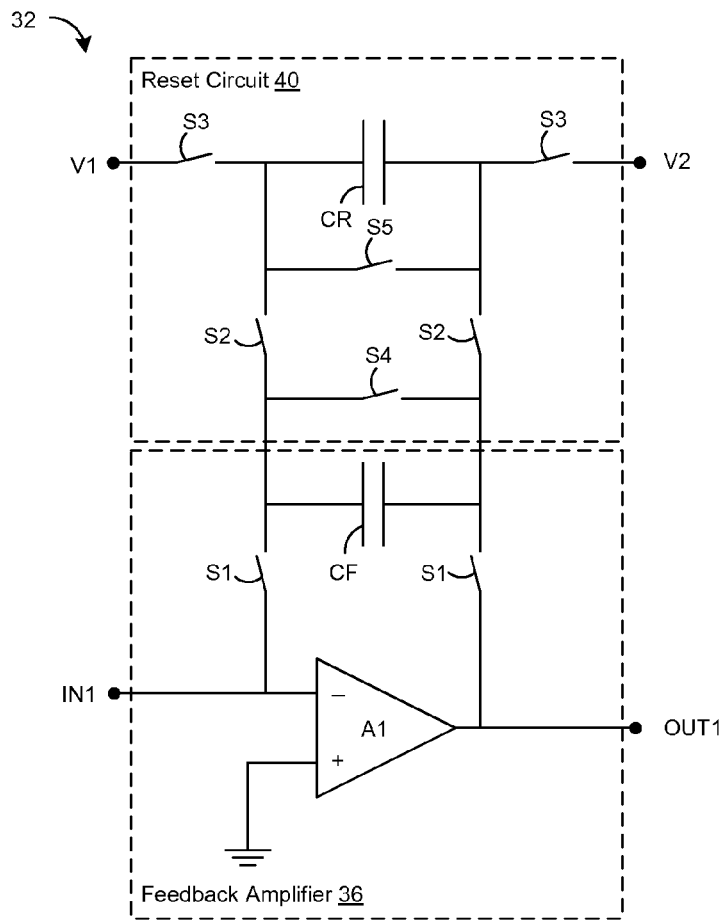
FIG. 5 is a circuit schematic depicting another embodiment of the feedback amplifier circuit.

FIG. 5 depicts another embodiment of the feedback amplifier circuit 32 that can be used in the multichannel feedback amplifier circuit 28 of FIG. 2. In FIG. 5, two additional switches S4, S5 can be added to the embodiment of the feedback amplifier circuit 32 of FIG. 2. A fourth switch S4 can be physically connected across the feedback capacitor CF, and a fifth switch S5 can be physically connected across the reset capacitor CR. These switches S4, S5 can be utilized to selectively discharge voltage differences and charge distributions that may exist across the feedback capacitor CF and reset capacitor CR. Also, in FIG. 5, the amplifier A1 can be a differential-input, single-ended amplifier, and the feedback capacitor CF can be physically connected between the single output terminal and the negative input terminal of the amplifier A1. However, as indicated above, the amplifier A1 can have any of a single-ended or differential input or output.

Figure 6:
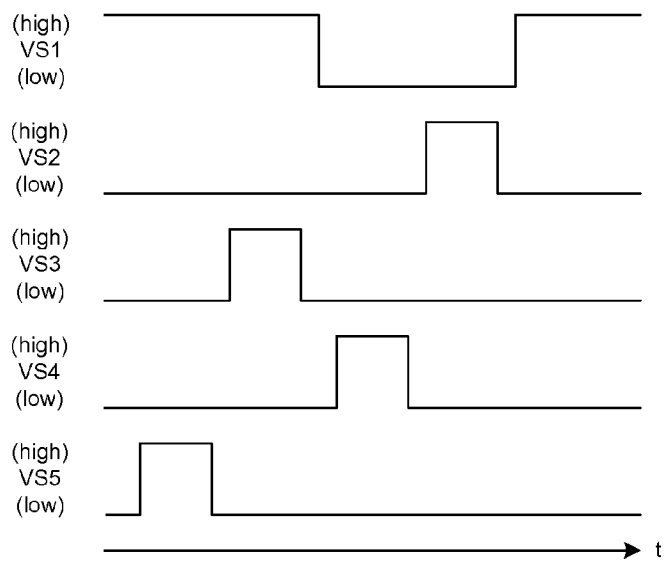
FIG. 6 is a signal diagram depicting additional embodiments of control signals for controlling switches of the feedback amplifier circuit or multichannel feedback amplifier circuit during the method of FIG. 3.

The feedback amplifier circuit 32 of FIG. 5 can be reset according to embodiments of the method 300 of FIG. 3, and the fourth and fifth switches S4, S5 can optionally be controlled in conjunction with the performance of this method 300. FIG. 6 depicts embodiments of control signals VS1-VS5 that can be generated by the control circuit 40 and delivered to the first, second, third, fourth and fifth switches S1-S5 during the performance of the method 300 to reset the feedback capacitor CF of the feedback amplifier circuit 32 of FIG. 5. In FIG. 6, the first, second and third control signals VS1, VS2, VS3 can have approximately the same interrelationship as described above and depicted in FIG. 4. Fourth and fifth control signals VS4, VS5 can be delivered to the fourth and fifth switches S4, S5 to selectively discharge voltage differences that may exist across the feedback and reset capacitors CF, CR.

Before step 302, the reset capacitor CR can be discharged by closing the fifth switch S5 to electrically short the two terminals of the reset capacitor CR to each other. In FIG. 6, the fifth control signal VS5 delivered to the fifth switch S5 can go from a logic low state to a logic high state to close the fifth switch S5. Also before step 302, the reset capacitor CR can be returned to an electrically floating state by opening the fifth switch S5 to electrically disconnect the two terminals of the reset capacitor CR from being shorted to each other. In FIG. 6, the fifth control signal VS5 delivered to the fifth switch S5 can go from a logic high state to a logic low state to open the fifth switch S5.

After step 306 and before step 308, the feedback capacitor CF can be discharged by closing the fourth switch S4 to electrically short the two terminals of the feedback capacitor CF to each other. In FIG. 6, the fourth control signal VS4 delivered to the fourth switch S4 can go from a logic low state to a logic high state to close the fourth switch S4. Also after step 306 and before step 308, the feedback capacitor CF can then be returned to an electrically floating state by opening the fourth switch S4 to electrically disconnect the two terminals of the feedback capacitor CF from being shorted to each other. In FIG. 6, the fourth control signal VS4 delivered to the fourth switch S4 can go from a logic high state to a logic low state to open the fourth switch S5.

In other embodiments, the reset capacitor CR and feedback capacitor CF can be discharged at selected times, during performance of the method 300 of FIG. 3, other than those depicted in FIG. 6 and described above.

The feedback and reset capacitors CF, CR may be selectively discharged to control the voltage values present at the individual terminals of the feedback and reset capacitors CF, CR before and after the imposing of the reset and selectable voltage differences across these capacitors CF, CR during performance of embodiments of the reset method 300 of FIG. 3. For example, the discharging of the reset capacitor CR before connecting it to the first and second voltages V1, V2 in step 302 can be used to control the individual voltage values imposed on the individual terminals of the reset capacitor CR upon imposing the selectable voltage difference across the reset capacitor CR in step 302.

Similarly, the discharging of the feedback capacitor CF before connecting it across the reset capacitor CR in step 308 can be used to control the individual voltage values imposed on the individual terminals of the feedback capacitor CF upon imposing the reset voltage difference across the feedback capacitor CF in step 308, and thus control a reset output voltage value from which the feedback amplifier circuit 32 can resume generating of the output signal OUT1 by processing the input signal IN1. The resetting of the feedback capacitor CF by the method 300 of FIG. 3 can result in a change in the value of the output OUT1 from which the feedback amplifier 36 will continue generating the output OUT1 by processing the input IN1. This can place the amplifier A1 back into a linear or otherwise desirable operating condition during its processing of the input IN1 to generate the output OUT1. The discharging of the feedback capacitor CF can therefore enhance control of the voltage value to which the output OUT1 is reset.

Figure 7:
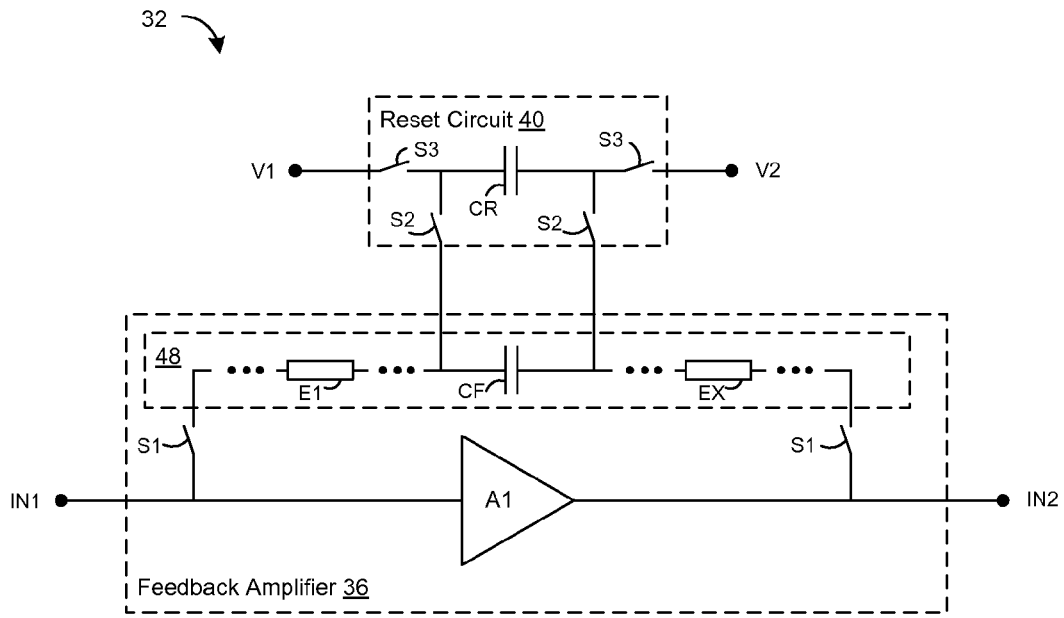
FIG. 7 is a circuit schematic depicting another embodiment of the feedback amplifier circuit.

As exemplarily depicted in FIGS. 2 and 5, the first switches S1 may connect a single feedback capacitor CF directly between the input and output of the amplifier A1 to implement the feedback amplifier circuit 36, e.g., to implement an integrator circuit. In other embodiments, the feedback amplifier 36 can include one or more feedback capacitors CF either directly or indirectly connected between the input and output of the amplifier A1 by one or more first switches S1, to implement various processing functions of the feedback amplifier 36, e.g., to implement operation of the feedback amplifier 36 as an amplifier, filter, etc. In such embodiments, the second switches S2 can physically connect the reset capacitor CR across one or more of the feedback capacitors CF. FIG. 7 depicts an exemplary embodiment of the feedback amplifier circuit 32 in which the feedback capacitor CF of the feedback amplifier 36 can optionally be included in a feedback network 48 connected between the input and output of the amplifier A1. The feedback network 48 can include one or more additional circuit elements E1-EX, such as resistors, capacitors, inductors, switches, etc., located at one or more of between the input of the amplifier A1 and a terminal of the feedback capacitor CF or between the output of the amplifier A1 and a terminal of the feedback capacitor CF. The feedback capacitor can also optionally be connected, either directly or indirectly, to a positive input terminal of a differential-input embodiment of the amplifier A1.

The feedback amplifier circuit 32 can process various kinds of input signals IN1, including one or more of a current input signal IN1 or a voltage input signal IN1. For example, an embodiment of the feedback amplifier circuit 32 can implement an integrator that can be one or more of a current integrator, e.g., that may receive an input current IN1 and produce an output voltage OUT1 as a function of an integration of the input current IN1; or a voltage integrator, e.g., that may receive an input voltage IN1 and produce an output voltage OUT1 as a function of an integration of the input voltage IN1.

Figure 8:
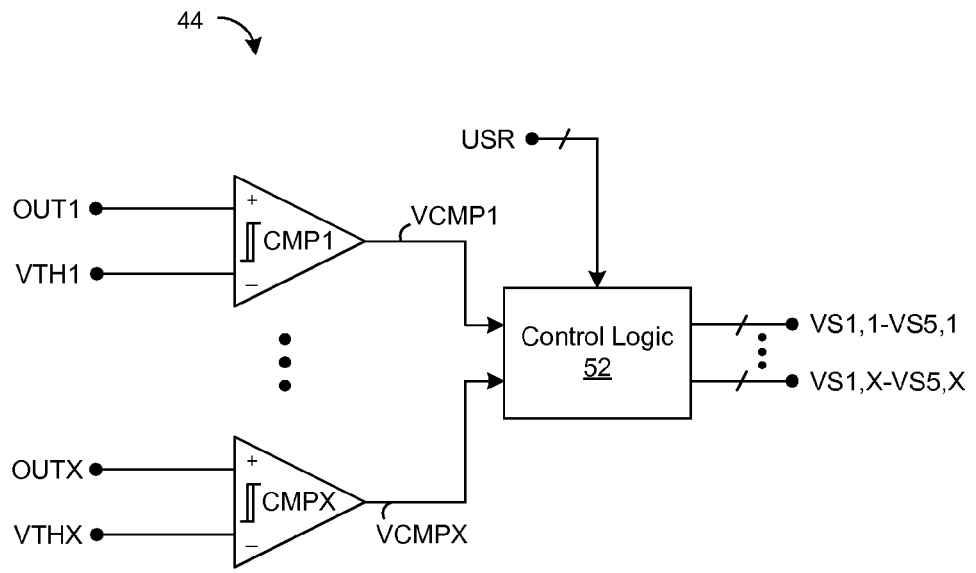
FIG. 8 is a circuit schematic depicting an embodiment of a control circuit of the feedback amplifier circuit or multichannel feedback amplifier circuit.

FIG. 8 depicts an embodiment of the control circuit 44 that can be used to generate and deliver control signals VS1-VS5 to the first, second, third, fourth and fifth switches S1-S5, as well as other control signals, such as clock, timing, etc. signals, used by the feedback amplifier circuit 32 or multichannel feedback amplifier circuit 28. The control circuit 44 can include a plurality of comparators CMP1-CMPX, each corresponding to and receiving an output OUT1-OUTX from a feedback amplifier circuit 32 of the multichannel feedback amplifier circuit 28, as well as a corresponding threshold voltage VTH1-VTHX. The plurality of comparators CMP1-CMPX can generate a plurality of comparison signals VCMP1-VCMPX, each indicating when the corresponding output signal OUT1-OUTX has increased in value beyond the corresponding threshold voltage VTH1-VTHX. Note that, although the control circuit 44 of FIG. 8 can depict comparators CMP1-CMPX indicating when the output signals OUT1-OUTX increase beyond corresponding threshold voltages VTH1-VTHX, in other embodiments the control circuit 44 can selectively indicate, for each of the feedback amplifier circuits 32, when outputs OUT1-OUTX rise above thresholds VTH1-VTHX, fall below thresholds VTH1-VTHX, or any combination thereof. The control circuit 44 can also include a control logic portion 52, which can receive the comparison signals VCMP1-VCMPX, as well as user input or configuration signals USR, and generate the control signals VS1,1-VS5,1 . . . VS1,X-VS5,X for delivery to the first, second, third, fourth and fifth switches S1-S5 of the plurality of feedback amplifier circuits 32. The control logic 52 can include one or more of logic gates, registers, memory, etc. The user input or configuration signals USR can be used select operating modes of the control circuit 44, e.g., in the form of real time control signals USR from a user or other circuit, or control signals USR that can program logic gates, registers or memory of the control logic 52 to select an operating mode. Operating modes of the control circuit 44 can include one or more of (i) selecting which of the plurality of feedback amplifier circuits 32 of the multichannel feedback amplifier circuit 28 are enabled to be reset if the corresponding comparison signal VCMP1-VCMPX is triggered, (ii) selecting which of the plurality of reset capacitors CR are charged to the selectable voltage difference related to V1-V2 during step 302 of the method 300 in FIG. 3; (iii) selecting one or more frequencies of operation of steps of the reset method 300 of FIG. 3, such as selecting a frequency of charging of the reset capacitors CR in step 302, as discussed further below.

FIG. 9 depicts an embodiment of additional control signals that can be received or generated by the control circuit 44 to control the operation of the feedback amplifier circuit 32 and multichannel feedback amplifier circuit 28. The control circuit 44 may receive or generate a clock signal VCLK having a certain frequency, such as a clock signal VCLK having a selectable frequency in response to a user control signal USR selecting the clock frequency. The control circuit 44 may also generate and use one or more reset enable signals VRE1-VREX, each having a selectable frequency related to the clock frequency, to enable or disable resetting of a corresponding feedback amplifier circuit 32. For example, in FIG. 9, the control circuit 44 can generate a first reset enable signal VRE1, enabling reset of a first selected one or more of the feedback amplifier circuits 32, having the same frequency as the clock signal VCLK, and another reset enable signal VREX, enabling reset of a second selected one or more of the feedback amplifier circuits 32, having a frequency that is half, or some other fraction or multiple, of the clock frequency. The reset enable signals VRE1-VREX can enable and disable resetting of the corresponding feedback amplifier circuits 32. When a feedback amplifier circuit 32 is enabled to be reset, the control circuit 44 can generate control signals VS1-VS5 to reset it as a function of its corresponding threshold comparison signal VTH1-VTHX. When a feedback amplifier circuit 32 is disabled from resetting, the control circuit 44 can refrain from generating control signals VS1-VS5 suitable to reset it, and the feedback amplifier circuit 32 can thereby be prevented from resetting, no matter what value the corresponding threshold comparison signal VTH1-VTHX takes.

FIGS. 10 and 11 depict embodiments of the multichannel feedback amplifier circuit 28 having the plurality of the feedback amplifier circuits 32. Referring briefly back to FIG. 2, each of the feedback amplifier circuits 32 can include a corresponding reset capacitor CR. However, in other embodiments of the multichannel feedback amplifier circuit 28, portions of components of the feedback amplifier circuit 32 can be configured to be shared among all or a subset of the plurality individual feedback amplifier circuits 32. In the embodiment of FIG. 10, for example, the plurality feedback amplifier circuits 32 can optionally share are single reset circuit 40 or portion of the reset circuit 40, e.g., can optionally share a single reset capacitor CR. In the embodiment of FIG. 11, the reset circuits 40 of the plurality feedback amplifier circuits 32 can optionally share a plurality of reset capacitors CR, where the number of the plurality of reset capacitors CR can be less than or more than the number of the plurality of feedback amplifier circuits 32.

FIG. 12 depicts an exemplary embodiment of an exemplary application circuit, a radiation detection circuit 56, that can include the multichannel feedback amplifier circuit 28. The radiation detection circuit 56 can be used in, e.g., a computed tomography (CT) scanner to detect radiation and produce digital representations thereof. The radiation-detection circuit can includes a photodiode array 60, the multichannel feedback amplifier circuit 28, and an analog-to-digital converter (ADC) 64. The photodiode array 60 can include a plurality of photodiodes D1-DX to receive radiation that may include, e.g., radiation in the visible spectrum. In a CT scanner application, a scintillator may be used to convert X-ray radiation to visible-spectrum radiation that can be provided to the photodiode array 60. The plurality of photodiodes D1-DX can be arranged in various physical embodiments, such as one- or two-dimensional spatial arrays that can capture radiation representing in pixels. The photodiode array 60 may output a plurality of current signals IN1-INX, each representing in analog current form the radiation received by that respective photodiode D1-DX. The multichannel feedback amplifier circuit 28 can receive the plurality of current signals IN1-INX and produce a plurality of output voltage signals OUT1-OUTX representing integrations of the current signals IN1-INX. The ADC 64 can receive the plurality of analog output voltages OUT1-OUTX from the multichannel feedback circuit 28 and produce therefrom one or more digital output signals DOUT representing, in digital form, a measure of the radiation received at the plurality of photodiodes D1-DX. The digital output signal DOUT can include one or more digital outputs DOUT, e.g., a plurality of parallel digital signals DOUT or a single multiplexed digital output signal DOUT.

Although the switch control signals VS1-VS5 have been depicted and described herein as enabling, i.e., closing, corresponding first, second, third, fourth and fifth switches S1-S5 when the control signals VS1-VS5 assume a logic high level, and disabling, i.e., opening, corresponding switches S1-S5 when the control signals VS1-VS5 assume a logic high level, the correspondence between enabling and disabling and assumed logic levels of the switch control signals VS1-VS5 can be selectively reversed for one or more of the switches S1-S5. That is, the switches S1-S5 and switch control signals VS1-VS5 can be configured so that one or more of the switches S1-S5 are enabled when the corresponding control signal VS1-VS5 assumes a logic low level, and disabled when the corresponding control signal VS1-VS5 assumes a logic high level. A mixture of logic-high and logic-low enabling, and logic-high and logic-low disabling, can also be used.

FIG. 13 depicts an exemplary embodiment of a transistor switch implementation that can be used to realize any of the first, second, third, fourth or fifth switches. In FIG. 13, an NMOS transistor N1 and a PMOS transistor P1 can be arranged in parallel, with sources of the NMOS and PMOS transistors N1, P1 connected together and connected to a first pass-through terminal VPT1, and drains of the NMOS and PMOS transistors N1, N2 connected together and connected to a second pass-through terminal VPT2. The gate of the NMOS transistor N1 can be connected to the switching control terminal VSC, and the gate of the PMOS transistor P1 can be connected to the switching control terminal via an inverter INV1. The body connections of the PMOS and NMOS transistors P1, N1 can be connected to first and second supply voltage terminals VSUP1, VSUP2, respectively. FIG. 14 depicts an exemplary embodiment of the inverter INV1. In FIG. 14, an NMOS transistor N2 and PMOS transistor P2 can be arranged with their gates connected together at the inverter input VINVI, and their drains connected together at the inverter output VINVO. The sources and bodies of the NMOS and PMOS transistors N2, P2 can be connected to first and second supply voltage terminals VSUP1, VSUP2.

Figures 15, 16:
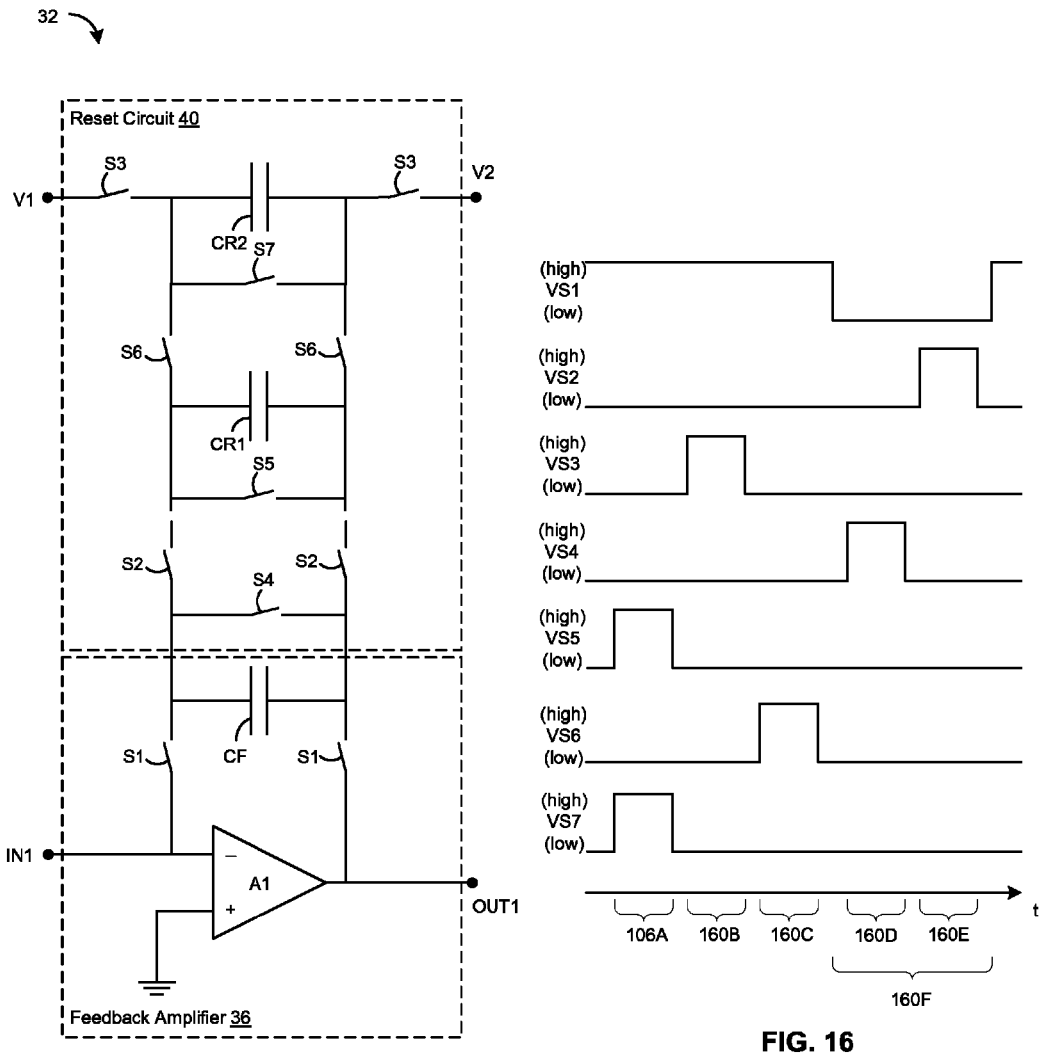
FIG. 15 is a circuit schematic depicting another embodiment of the feedback amplifier circuit.
FIG. 16 is a signal diagram depicting embodiments of control signals for controlling switches of the feedback amplifier circuit of FIG. 15.

The reset circuit 40 can also optionally include a plurality of reset capacitors. FIG. 15 depicts an embodiment of the feedback amplifier circuit 32 in which the reset circuit 40 includes a first reset capacitor CR1 and a second reset capacitor CR2. The feedback amplifier circuit 32 and reset circuit 40 of FIG. 15 include the first, second, third, fourth and fifth switches S1, S2, S3, S4, S5 in substantially similar roles as in the embodiment of FIG. 5, but adapted so that the second switches S2 can now connect the feedback capacitor CF to the first reset capacitor CR1, the fifth switch S5 can now discharge the first reset capacitor CR1, and the third switches S3 can now connect the second reset capacitor CR2 to the first and second voltages V1, V2. The embodiment of the reset circuit 40 of FIG. 15 can also include a plurality of sixth switches S6 physically connecting the second reset capacitor CR2 across the first reset capacitor CR1 and a seventh switch S7 physically connected across the second reset capacitor CR2.

The plurality of reset capacitors CR1, CR2 can be used to reset the feedback capacitor CF in stages, to further improve the determinability and accuracy of the reset voltage imposed on the feedback capacitor CF by the reset operation. For example, in FIG. 15, the feedback capacitor CF can be reset by electrically connecting it in parallel with the first reset capacitor CR1, which itself can be reset by it being electrically connected in parallel with the second reset capacitor CR2, which can have a selectable voltage difference imposed upon it by it being electrically connected to the first and second voltages V1, V2.

Embodiments of the reset method 300 can be adapted to incorporate this staged reset operation using the plurality of reset capacitors CR1, CR2. FIG. 16 depicts exemplary embodiments of control signals that can be used to implement the reset method 300 to perform a reset using the plurality of reset capacitors CR1, CR2. In a first time period 160A, the first and second reset capacitors CR1, CR2 can be discharged by closing the fifth and seventh switches S5, S7 by bringing the fifth and seventh control signals VS5, VS7 high. In a second time period 160B, the second reset capacitor CR2 can be charged to a selectable voltage difference by closing the third switches S3 by bringing the third control signal VS3 high. In a third time period 160C, the first reset capacitor CR1 can be charged to an intermediate reset voltage, i.e., reset, by electrically connecting it across the second reset capacitor CR2 by closing the sixth switches S6 by bringing the sixth control signal VS6 high. During the above time periods, the feedback amplifier 36 can continue to process the input signal IN1 to produce the output signal OUT1 by keeping the first switch S1 closed and the second and fourth switches S2, S4 open by means of the first, second and fourth control signals VS1, VS2, VS4 being high, low and low, respectively. In a fourth time period 160D, the feedback capacitor CF can be discharged by closing the fourth switch S4 by bringing the fourth control signal VS4 high. In a fifth time period 160E, the feedback capacitor CF can be charged to a reset voltage difference, i.e., reset, by electrically connecting it across the first reset capacitor CR1 by closing the second switches S2 by bringing the second control signal VS2 high. During a sixth time period 160F, covering the fourth and fifth time periods 160D, 160E, the feedback amplifier 36 can be disconnected from regular processing of the input IN1 to produce the output OUT1 by opening the first switches S1 by bringing the first control signal VS1 low.

Figure 17:
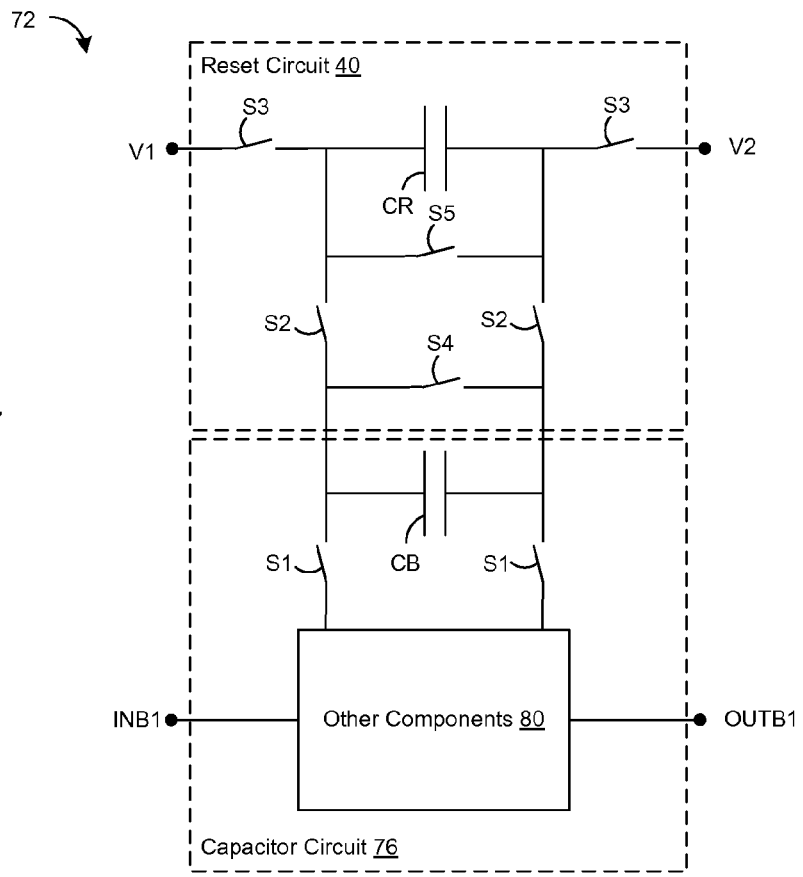
FIG. 17 is a circuit schematic depicting an embodiment of a resettable circuit.

Embodiments of the reset circuit 40 and the method 300 of utilizing it can also be incorporated into and used with any circuit that includes a capacitor for which it is desirable to reset or otherwise change a voltage thereon. FIG. 17 depicts an embodiment of a circuit 72 that can include the reset circuit 40 and a capacitor circuit 76 having at least one capacitor CB and other components 80. The capacitor circuit 76 can be any circuit that utilizes the capacitor CB for which it is desirable to reset or otherwise change a voltage thereon, and the other components 80 can include any circuit components, arranged in any fashion, connected to the capacitor CB and an input INB1 and output OUTB1 of the capacitor circuit 76. The capacitor circuit 76 can be an amplifier circuit, a filter circuit, a converter circuit, a regulator circuit, or any other type of circuit, and the other components 80 can be selected to implement such circuits. Note that, although FIG. 17 depicts an embodiment of the reset circuit 40 including each of the second, third, fourth and fifth switches S2, S3, S4, S5, any other embodiment of the reset circuit 40 can also be used, e.g., in which the discharge switches S4, S5 can be optionally omitted, or in which multiple reset capacitors CR1, CR2 can be used, etc.

The reset circuit 40 of FIG. 17 can be operated as described above, e.g., according to embodiments of the method 300. For example, the circuit 72 can operate according to a first phase of operation in which the first switches S1 are closed, the second and fourth switches S2, S4 are open, and the capacitor circuit 76 operates regularly to amplify, filter, convert, regulate, or perform any other type of function that the circuit is configured to perform. The circuit 72 can also operate according to a second phase of operation in which the first switches S1 are open, the second and fourth switches S2, S4 are selectively closed, as described above, and the capacitor CB of the capacitor circuit 76 can be reset or have a voltage thereon otherwise selectively changed.

Figure 18:
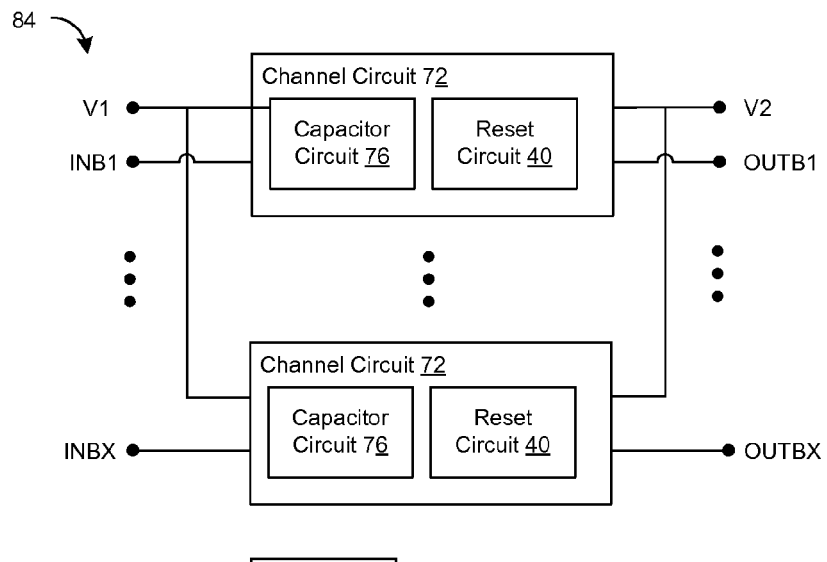
FIG. 18 is a circuit schematic depicting a multichannel embodiment the resettable circuit of FIG. 17.

The circuit 72 of FIG. 17 can also be used in a multichannel embodiment. FIG. 18 depicts an embodiment of a multichannel circuit 84 incorporating a plurality of the circuits 72 of FIG. 17, which can be referred to as channel circuits 72 in such an embodiment. The plurality of channel circuits 72 can receive a plurality of input signals INB1-INBX and provide a plurality of output signals OUTB1-OUTBX. The multichannel circuit 84 and the plurality of feedback circuits 40 incorporated therein can be operated as described above, e.g., in regard to embodiments of the multichannel feedback amplifier circuit 28 and the method 300.

Additional embodiments of the feedback amplifier circuit 32, multichannel feedback amplifier circuit 28, channel circuit 72 and multichannel circuit 84 are possible. For example, embodiments of the reset circuit 40 having a plurality of reset capacitors can include more than two reset capacitors. Switches described herein can generally be configured to be activated by either logic high or logic low control signals, and any control signals described herein can be configured to operate in either manner. As already described above, the various switches described herein can optionally be activated in varying order and for varying lengths of time, even within a particular circuit embodiment having a particular architecture. Additionally, some switch pairs described herein can be implemented as a single switch in some embodiments. Also, any feature of any of the embodiments of the feedback amplifier circuit 32, multichannel feedback amplifier circuit 28, channel circuit 72 or multichannel circuit 84 described herein can optionally be used in any other embodiment of the feedback amplifier circuit 32, multichannel feedback amplifier circuit 28, channel circuit 72 or multichannel circuit 84. Embodiments of the feedback amplifier circuit 32, multichannel feedback amplifier circuit 28, channel circuit 72 or multichannel circuit 84 can also optionally include any subset of the components or features of any embodiments of the feedback amplifier circuit 32, multichannel feedback amplifier circuit 28, channel circuit 72 and multichannel circuit 84 described herein.

What is claimed is:

1. An amplifier system, comprising:
   an amplifier;
   a feedback capacitor connected between an input terminal and an output terminal of the amplifier by at least one first switch;
   a reset capacitor connected across the feedback capacitor by at least one second switch and between a pair of reference voltages by at least one third switch; and
   a control circuit to selectively enable and disable the at least one first, second and third switches to electrically connect the reset capacitor between the pair of reference voltages during a first phase of a clocking signal and across the feedback capacitor during a second phase of the clocking signal.

2. An amplifier system, comprising:
   an amplifier;
   a feedback capacitor connected between an input terminal and an output terminal of the amplifier by at least one first switch;
   a reset capacitor connected across the feedback capacitor by at least one second switch and between a pair of reference voltages by at least one third switch; and
   at least one of: a discharge switch connected across the feedback capacitor, or a discharge switch connected across the reset capacitor.

3. The amplifier system of claim 1, wherein the feedback capacitor is connected between the input and output terminals of the amplifier by a first pair of switches, and the reset capacitor is connected across the feedback capacitor by a second pair of switches and between the pair of reference voltages by a third pair of switches.

4. The amplifier system of claim 1, wherein the control circuit controls operation of the amplifier system by:
   during an input-signal processing phase of operation, switching the feedback capacitor to be electrically connected between the input and output terminals of the amplifier and switching the reset capacitor to be electrically connected between the pair of reference voltages; and
   during a reset phase of operation, switching the reset capacitor to not be electrically connected between the pair of reference voltage and instead be electrically connected across the feedback capacitor.

5. The amplifier system of claim 1, wherein the control circuit closes the at least one first switch and opens the at least one second switch to electrically connect the feedback capacitor between the input and output terminals to engage feedback processing of an input signal at the input terminal of the amplifier to generate an output signal at the output terminal of the amplifier.

6. The amplifier system of claim 1, wherein the control circuit electrically connects the reset capacitor between the reference voltages to charge the reset capacitor to a selectable voltage difference.

7. The amplifier system of claim 1, wherein the control circuit electrically connects the reset capacitor across the feedback capacitor to reset the feedback capacitor to a reset voltage difference using the reset capacitor.

8. The amplifier system of claim 7, wherein the control circuit opens the at least one second switch and closes the at least one first switch after the resetting of the feedback capacitor to resume feedback processing to generate an output signal starting at a reset output voltage value.

9. The amplifier system of claim 1, further comprising a plurality of feedback amplifier circuits, each including the amplifier, the feedback capacitor connected between the input terminal and the output terminal of the amplifier by the at least one first switch, and the reset capacitor connected across the feedback capacitor by the at least one second switch and between the first and second voltages by the at least one third switch.

10. The amplifier system of claim 9, wherein the reset capacitors of the plurality of feedback amplifier circuits are a same common reset capacitor.

11. The amplifier system of claim 9, wherein the control circuit closes the at least one third switch and opens the at least one second switch of a selected number of the feedback amplifier circuits to electrically connect the reset capacitors of the selected feedback amplifier circuits between the reference voltages to charge the reset capacitors to a selectable voltage difference.

12. The amplifier system of claim 9, wherein the control circuit opens the at least one third switch, closes the at least one second switch and opens the at least one first switch of a selected number of feedback amplifier circuits to electrically connect the reset capacitor of the selected feedback amplifier circuits across the corresponding feedback capacitors of the selected feedback amplifier circuits to reset the feedback capacitors to a reset voltage difference using the reset capacitors.

13. The amplifier system of claim 12, wherein at least two of the feedback amplifier circuits are reset at respectively different frequencies.

14. The amplifier system of claim 12, wherein the control circuit opens the at least one second switch and closes the at least one first switch of the selected feedback amplifier circuits after the resetting of the feedback capacitor to resume feedback processing by the selected feedback amplifier circuits of input signals at the corresponding amplifier input terminals to generate output signals at the corresponding amplifier output terminals.

15. The amplifier system of claim 1, wherein the control circuit electrically disconnects the feedback capacitor from between the input and output terminals during the second phase of the clocking signal.

16. The amplifier system of claim 1, wherein the first and second phases of the clocking signal do not overlap each other in time.

17. An amplifier-system control method, comprising:
   connecting a feedback capacitor between an input terminal and an output terminal of an amplifier by at least one first switch;
   connecting a reset capacitor across the feedback capacitor by at least one second switch and between a pair of reference voltages by at least one third switch; and
   selectively enabling and disabling the at least one first, second and third switches to electrically connect the reset capacitor between the pair of reference voltages during a first phase of a clocking signal and across the feedback capacitor during a second phase of the clocking signal.

18. An amplifier-system control method, comprising:
   connecting a feedback capacitor between an input terminal and an output terminal of an amplifier by at least one first switch;
   connecting a reset capacitor across the feedback capacitor by at least one second switch and between a pair of reference voltages by at least one third switch; and
   at least one of: connecting a first discharge switch across the feedback capacitor, or connecting a second discharge switch across the reset capacitor.

19. The amplifier-system control method of claim 17, further comprising:
   during an input-signal processing phase of operation, switching the feedback capacitor to be electrically connected between the input and output terminals of the amplifier and switching the reset capacitor to be electrically connected between the pair of reference voltages; and
   during a reset phase of operation, switching the reset capacitor to not be electrically connected between the pair of reference voltage and instead be electrically connected across the feedback capacitor.

20. The amplifier-system control method of claim 17, further comprising closing the at least one first switch and opening the at least one second switch to electrically connect the feedback capacitor between the input and output terminals to engage feedback processing by the feedback amplifier circuit of an input signal at the input terminal of the amplifier to generate an output signal at the output terminal of the amplifier.

21. The amplifier-system control method of claim 17, wherein the electrically connecting the reset capacitor between the reference voltages charges the reset capacitor to a selectable voltage difference.

22. The amplifier-system control method of claim 17, wherein the electrically connecting the reset capacitor across the feedback capacitor resets the feedback capacitor to a reset voltage difference using the reset capacitor.

23. The amplifier-system control method of claim 22, further comprising opening the at least one second switch and closing the at least one first switch after the resetting of the feedback capacitor to resume feedback processing by the feedback amplifier circuit to generate the output signal staring at a reset output voltage value.

24. The amplifier-system control method of claim 17, further comprising, in a plurality of feedback amplifier circuits including the amplifier, feedback capacitor and reset capacitor, the connecting of the feedback capacitor and the connecting of the reset capacitor.

25. The amplifier-system control method of claim 24, wherein the reset capacitors of the plurality of feedback amplifier circuits are a same common reset capacitor.

26. The amplifier-system control method of claim 24, further comprising closing the at least one third switch and opening the at least one second switch of a selected number of the feedback amplifier circuits to electrically connect the reset capacitors of the selected feedback amplifier circuits between the reference voltages to charge the reset capacitors to a selectable voltage difference.

27. The amplifier-system control method of claim 24, further comprising opening the at least one third switch, closing the at least one second switch and opening the at least one first switch of a selected number of the feedback amplifier circuits to electrically connect the reset capacitor of the selected feedback amplifier circuits across the corresponding feedback capacitors of the selected feedback amplifier circuits to reset the feedback capacitors to a reset voltage difference using the reset capacitors.

28. The amplifier-system control method of claim 27, further comprising resetting at least two of the feedback amplifier circuits at respectively different frequencies.

29. The amplifier-system control method of claim 27, further comprising opening the at least one second switch and closing the at least one first switch of the selected feedback amplifier circuits after the resetting of the feedback capacitor to resume feedback processing by the selected feedback amplifier circuits of input signals at the corresponding amplifier input terminals to generate output signals at the corresponding amplifier output terminals.

30. A circuit, comprising:
   a feedback capacitor connected to other components by at least one first switch;
   a reset capacitor connected across the feedback capacitor by at least one second switch and between a pair of reference voltages by at least one third switch; and
   a control circuit to selectively enable and disable the at least one first, second and third switches to electrically connect the reset capacitor between the pair of reference voltages during a first phase of a clocking signal and across the feedback capacitor during a second phase of the clocking signal.

31. A circuit, comprising:
   a feedback capacitor connected to other components by at least one first switch;
   a reset capacitor connected across the feedback capacitor by at least one second switch and between a pair of reference voltages by at least one third switch; and
   at least one of: a discharge switch connected across the feedback capacitor, or a discharge switch connected across the reset capacitor.

32. The circuit of claim 30, wherein the feedback capacitor is connected to the other components by a first pair of switches, and the reset capacitor is connected across the feedback capacitor by a second pair of switches and between the pair of reference voltages by a third pair of switches.

33. The circuit of claim 30, wherein the control circuit controls operation of the circuit by:
   during a non-reset phase of operation, switching the feedback capacitor to be electrically connected to the other components and switching the reset capacitor to be electrically connected between the pair of reference voltages; and
   during a reset phase of operation, switching the reset capacitor to not be electrically connected between the pair of reference voltage and instead be electrically connected across the feedback capacitor.

* * * * *